United States Patent [19]

Swanson

[11] Patent Number: 5,754,082

[45] Date of Patent: May 19, 1998

[54] N-WAY COMBINER

[75] Inventor: Hilmer Irvin Swanson, Quincy, Ill.

[73] Assignee: Harris Corporation, Melbourne, Fla.

[21] Appl. No.: 672,084

[22] Filed: Jun. 27, 1996

[51] Int. Cl.$^6$ ........................................... H03H 7/48
[52] U.S. Cl. ............................................ 333/124; 333/100
[58] Field of Search ...................... 333/100, 124, 333/125, 127, 128, 136

[56] References Cited

U.S. PATENT DOCUMENTS

| 3,529,265 | 9/1970 | Podell | 333/127 |
|---|---|---|---|
| 4,556,856 | 12/1985 | Presser | 333/124 |
| 5,430,418 | 7/1995 | Blodgett | 333/100 |

*Primary Examiner*—Paul Gensler
*Attorney, Agent, or Firm*—Tarolli, Sundheim, Covell, Tummino & Szabo

[57] ABSTRACT

An N-way power combiner is presented herein for combining N RF signals. This combiner includes N input ports each for receiving an RF input signal. N transmission paths respectively extend from the N input ports to a common output port. N reject loads are respectively associated with the N paths, with each reject load having first and second ends with the second ends of the N reject loads being connected together in common. N impedance networks are respectively associated with the N paths. Each of the N impedance networks includes an inductor coil. A common connection means is provided for the inductor coils and the connection means has opposing sides. The N inductor coils are symmetrically arranged relative to the common connection means with some of the coils being located on one side of the common connection means and the other coils being located on the opposite side of the common connection means.

8 Claims, 4 Drawing Sheets

5,754,082

N-WAY COMBINER

BACKGROUND OF THE INVENTION

1. Technical Field

The present invention is directed generally to a power combiner and more specifically to a high power combiner.

2. Description of the Prior Art

In radio frequency (RF) transmitting systems, the need arises to transmit power at much higher levels than can be obtained from an individual power amplifier. In these situations, a power combiner is used to obtain the desired transmitted power. A power combiner is a device which has a plurality of input ports and an output port. Each input port is connected to the output of a power amplifier. At its output port, the power combiner provides power equal to the summation of the power from the individual power amplifiers. If a power combiner is used in the reverse direction, it is known as a power splitter. When operating as a splitter, a power amplifier provides power to the output port of the combiner and a fraction of this power is output at each combiner input port.

In prior art high power combiners, a plurality of two-way combiners are combined to obtain the desired power output. If double the power of one transmitter is needed, two transmitters are combined to obtain double the power. When four times the power of one transmitter is required, the outputs from two two-way transmitters are combined through a third two-way combiner. This approach of utilizing a plurality of two-way combiners is expensive due to the duplicate components required for each two-way combiner. Attempts to construct an N-way solid state high power combiner have yielded similarly unsatisfactory results due to the physical size of the components required to handle the required power levels. The shear size of the components involved and their physical location results in differing electrical characteristics resulting in poor isolation between some of the input ports.

It is an object of the present invention to provide a combiner that may combine more than two inputs in a single combiner. This is accomplished with a combiner that exhibits a high degree of symmetry in the arrangement of components even though many of the components of the combiner must be very large to handle a large amount of power. While vacuum tube transmitters have dominated the high power broadcasting and RF generation field, the improvements herein permit use of solid-state transmitters that in many instances previously required vacuum tube transmitters.

SUMMARY OF THE INVENTION

The present invention is directed toward an N-way power combiner for combining N RF signals. This combiner includes N input ports each for receiving an RF input signal. N transmission paths respectively extend from the N input ports to a common output port. N reject loads are respectively associated with the N paths, with each reject load having first and second ends with the second ends of the reject loads being connected together in common. N impedance networks are respectively associated with the N paths. Each of the N impedance networks includes an inductor coil. A common connection means is provided for the inductor coils and the connection means has opposing sides. The N inductor coils are symmetrically arranged relative to the common connection means with some of the coils being located on one side of the common connection means and the other coils being located on the opposite side of the common connection means.

BRIEF DESCRIPTION OF THE DRAWINGS

The foregoing and other features of the present invention will become apparent to one skilled in the art to which the present invention relates upon consideration of the following description of the invention with reference to the accompanying drawings, wherein.

DESCRIPTION OF PREFERRED EMBODIMENTS

Figure 1:
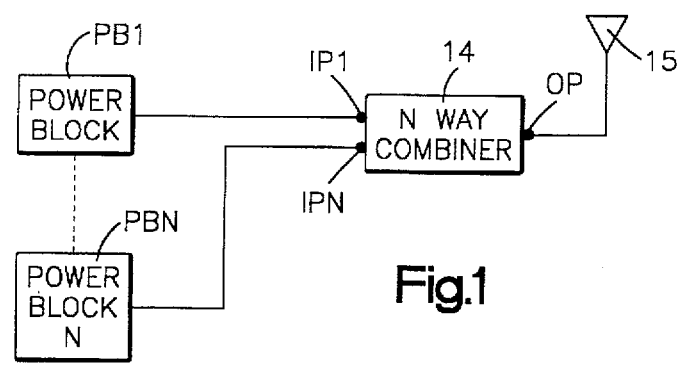
FIG. 1 is a block diagram illustrating a plurality of power blocks connected to an N-way combiner constructed in accordance with the present invention.

Reference is now made to the drawings and, more particularly, to FIG. 1 which illustrates a plurality of RF signal sources referred to as power blocks PB1 through PBN which respectively supply RF signals to input ports IP1 through IPN of an N-way combiner 14 having a common output port OP extending to an antenna 15. The power blocks PB1 through PBN are RF amplifier devices and each may take the form, for example, as that described hereinafter with reference to FIG. 2. The N-way combiner 14 is described in greater detail hereinafter with reference to the schematic-block diagram illustration of FIG. 3 and in the diagrams of FIGS. 4–8.

Figure 2:
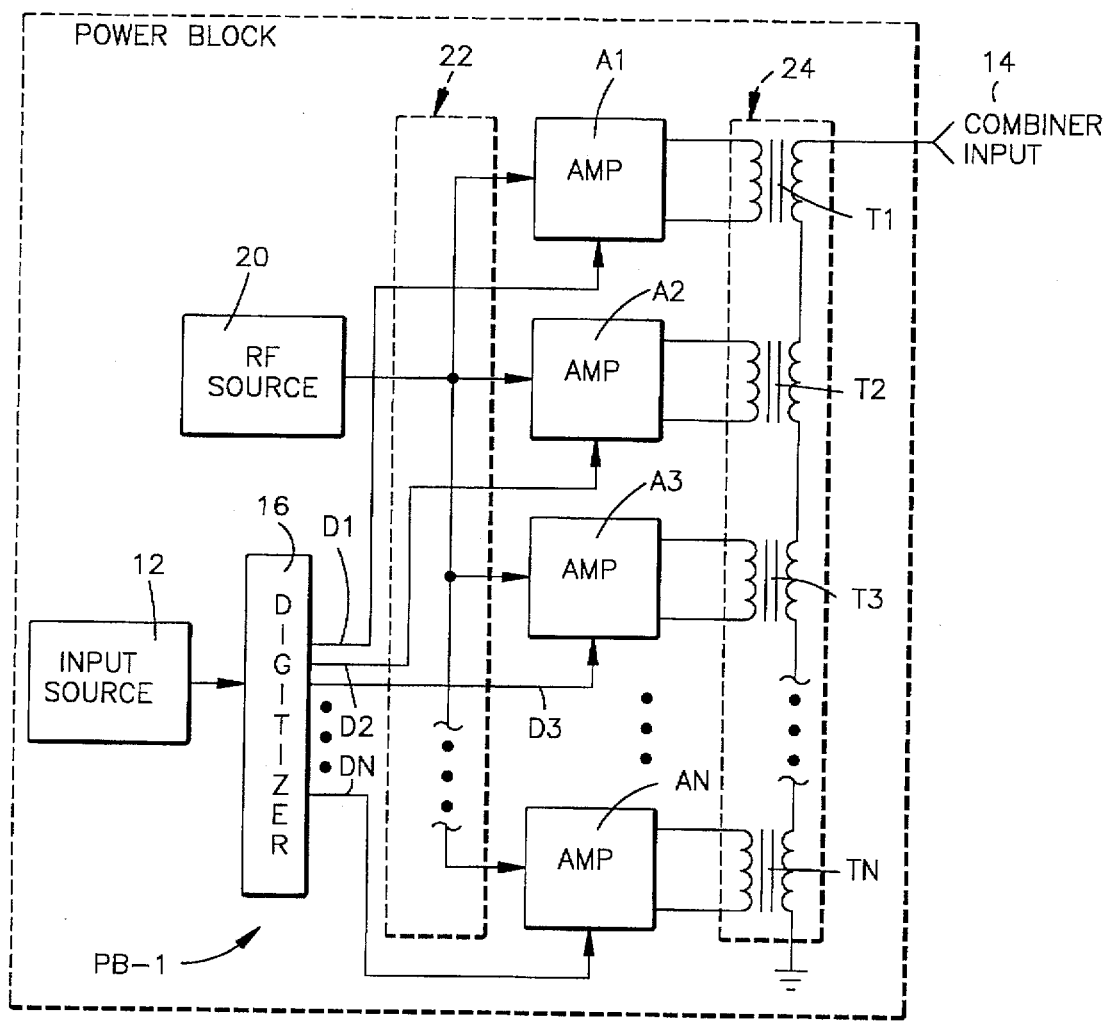
FIG. 2 is a schematic-block diagram of a prior art power block including a plurality of amplifiers.
Figure 3:
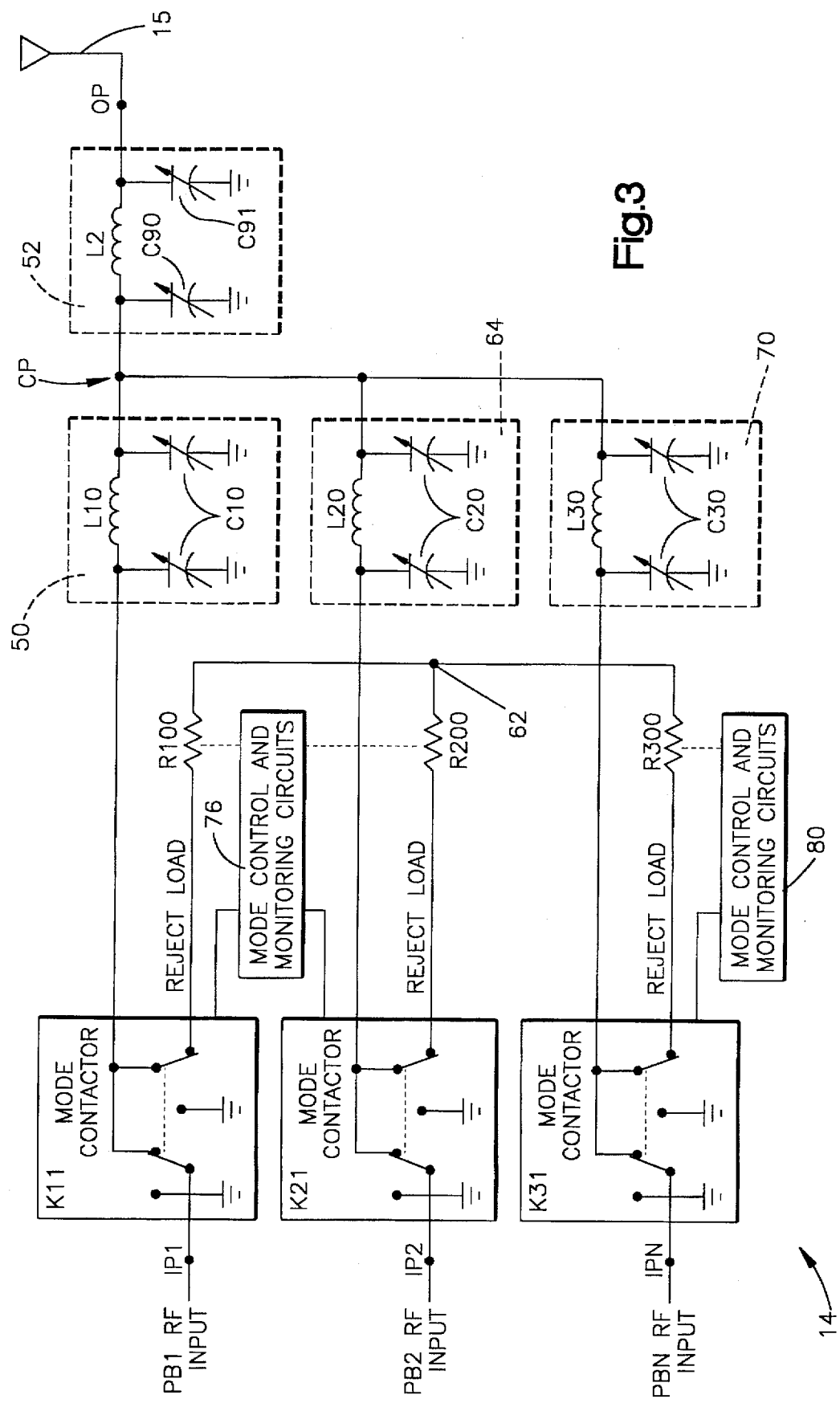
FIG. 3 is a schematic-block diagram of an N-way combiner constructed in accordance with the present invention.

Referring now to FIG. 2, a power block PB-1 is illustrated as receiving an input signal from input source 12 which may be the source of an audio or video signal. The power block generates an RF carrier signal which is amplitude modulated as a function of the amplitude of the input signal from source 12. The amplitude modulated carrier signal is provided to one input of a power combiner 14 (FIG. 3). A digitizer 16 provides a plurality of digital control signals D1 through DN which have values which vary in accordance with the instantaneous level of the input signal. The control signals are binary signals each having a binary 1 or a binary 0 level. The number of signals having binary 1 or binary 0 levels is dependent upon the instantaneous level of the input signal.

Each of the output control signals D1–DN is supplied to one of a plurality of N RF power amplifiers $A_1$–$A_N$. The control signals serve to turn associated power amplifiers either on or off. Thus, if the control signal has a binary 1 level, then its associated amplifier is inactive and no signal is provided at its output. However, if the control signal is of a binary 0 level, then the power amplifier is active and an amplified carrier signal is provided at its output. Each power amplifier has an input connected to a common RF source 20. The RF source 20 serves as the single source of an RF carrier signal which is supplied by way of an RF splitter 22 so that each amplifier $A_1$–$A_N$ receives a signal of like amplitude and phase and frequency. The carrier signal is amplitude modulated in accordance with the control signals D1–DN and the amplitude modulated carrier signals will be of like frequency and phase. These signals are supplied to a combiner circuit 24 comprised of a plurality of transformers $T_1$, $T_2$, $T_3$, ... $T_N$. The secondary windings act as an independent signal source, whereby the signals provided by the various transformers additively combine with one another to produce a combined signal which is supplied to the power combiner 14. This combined signal has the same frequency as the RF signal supplied by the RF source 20, but the amplitude of the combined signal is modulated in accordance with the input signal supplied by the input source 12.

Reference is now made to FIG. 3 which is a schematic-block diagram illustration of the N-way combiner 14 constructed in accordance with the present invention. The outputs of the power blocks PB1 through PBN are respectively connected to input ports IP1 through IPN so that these ports receive RF input signals from the various power blocks. The transmission paths that extend between the input ports IP1 through IPN to the output port OP will now be described in detail.

The first transmission path extends from the input port IP1 to the output OP and includes a mode contactor switch network K11 together with an impedance matching network 50 connected to a common connection point CP. The common connection point CP is, in turn, connected to the output port OP by means of another impedance matching network 52. This transmission path also includes a reject load R100 connected to a common point 62.

In a similar manner, the second transmission path is connected from the input port IP2 to the output port OP and includes a second mode contactor switch arrangement K21 together with an impedance matching network 64 which is connected to the common point CP. This second transmission path also includes a reject load R200 having one end connected in common with one end of reject load R100 at the common point 62. Each of the N transmission paths is the same as described above. An additional path is shown in FIG. 3 with reference to input port IPN and this path includes a mode contactor switching network K31 together with an impedance matching network 70 which is connected to the common point CP. This third path also includes a reject load R300 having one end connected in common with loads R100 and R200 at the common point 62. Mode control and monitoring circuits 76 and 80 are associated with various transmission paths. Each serves to monitor the magnitude of the current flowing through the associated reject load. If a substantial reject current is present due to a failed power block for approximately 12 seconds, the monitoring circuit will shut-off the offending power block by activating the mode contactor switches from the position as shown in networks K11, K21 and K31 to a position wherein the contactor switches connect the associated power block output to ground and the associated impedance matching network to ground. For example, if a substantial reject current is detected in the reject load R200 by the monitoring circuit 76, then it will activate the mode contactor K21 to cause the output of power block PB2 to be connected to ground and to connect one end (the left end in FIG. 3) of the network 64 to ground.

Each of the impedance matching networks 50, 64 and 70 associated with one of the transmission paths is constructed as shown with reference to network 50. Network 50 includes an inductor coil L10 together with a pair of adjustable capacitors C10. Similarly network 64 includes an inductor coil L20 together with a pair of adjustable capacitors C20. Network 70 includes an inductor coil L30 together with a pair of adjustable capacitors C30.

The impedance matching network 52 located between the common point CP and the output port OP includes an inductor coil L2 together with a pair of adjustable capacitors C90 and C91.

Each of the reject loads R100, R200 and R300 is made up of several resistors in a series-parallel combination to form a floating load (not connected to ground). The magnitude of each floating load may be on the order of 40 ohms, for example. In such case, a reject load may then be made up of 36, 1440 ohm resistors in a series-parallel combination.

The combiner serves to combine a plurality of N power blocks into a single output at the output port OP which is connected to a load, such as an antenna 15. If each power block PB1 through PBN provides 200 kilowatts of power, and if N is equal to eight, then the output load may be on the order of 50 ohms. The combiner functions as an impedance transformer and produces a 90° phase shift and required impedance transformations. In the example being illustrated, there are N (or eight) 90° matching networks each having associated therewith a floating reject load.

If the output load of each of the power blocks is at 40 ohms, then the combining networks serve to transform each of the 40 ohm power block outputs up to 250 ohms at the common point CP. The common point impedance (Z) may, for example, be on the order of 250 ohms divided by the total number of power blocks being combined. In this case, N is equal to eight or Z is equal to 250 divided by 8.

The reject loads absorb any imbalances in either amplitude or phase of the individual power block RF outputs. In normal operation, each of the reject loads has one end tied (through a mode contactor switch) to a power block output and the other end is connected in common with that of other reject loads. In normal operation, essentially no power is dissipated in the reject loads. An imbalance between the power block outputs in either phase or amplitude will cause current to flow through the reject loads, with minimal effect on the overall output.

Figure 6:
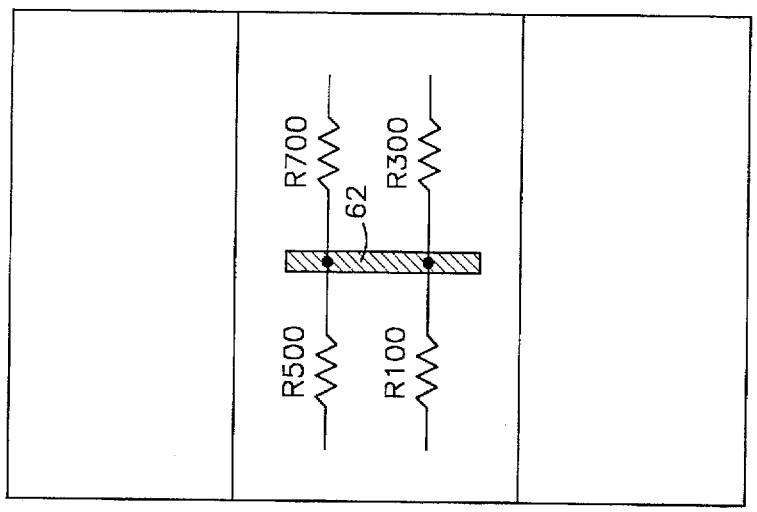
FIG. 6 is a view taken generally along line 6—6 in FIG. 4 looking in the direction of the arrows.
Figure 5:
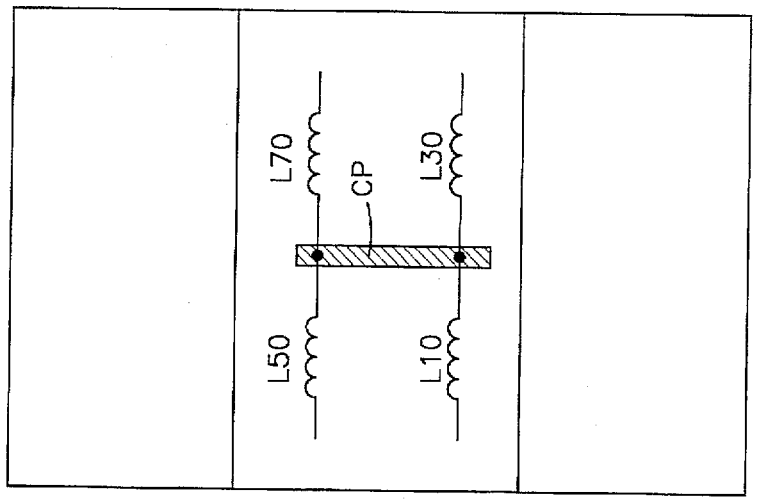
FIG. 5 is a view taken generally along line 5—5 in FIG. 4 looking in the direction of the arrows.
Figure 4:
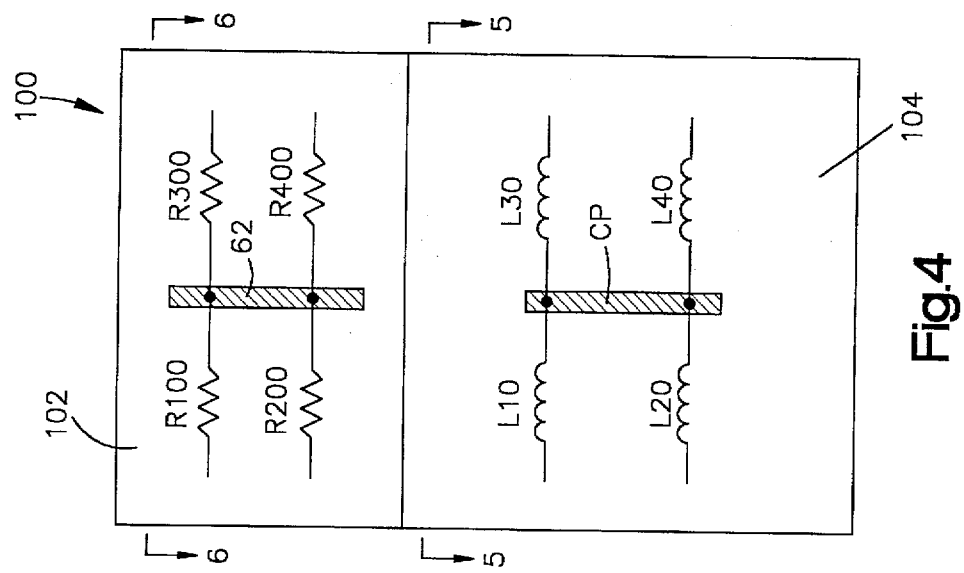
FIG. 4 is schematic illustration of a cabinet or housing for the combiner and having upper and lower compartments respectively containing a plurality of reject loads and a plurality of impedance network inductor coils all arranged in accordance with the present invention.

Reference is now made to FIGS. 4, 5 and 6 which illustrate a combiner cabinet 100 having an upper compartment 102 and a lower compartment 104. These figures illustrate the symmetry of the physical arrangement of the various reject loads and that of the various inductor coils employed in the impedance matching networks, all described hereinbefore with reference to the schematic diagram of FIG. 3.

In FIGS. 4 and 6, the reject loads are arranged in a symmetrical fashion in the upper compartment 102 of cabinet 100. Each reject load has one end connected in common to a common junction 62. The junction 62 as shown in FIGS. 4 and 6 may take the form of a conductive plate which may have a size on the order of 12 inches by 12 inches and approximately ⅛ inch thick and made of low impedance conductive material. One end of each reject load is secured, as by soldering or the like, to the plate 62 to provide the symmetric arrangement as indicated in FIGS. 4 and 6. It is to be understood that when N is equal to eight there are two additional reject loads R600 and R800 that are not shown in FIGS. 4 and 6. Resistor R600 in such an arrangement would be located immediately behind resistor R200 in FIG. 4 and immediately below resistor R500 in FIG. 6. Similarly resistor R800 would be located immediately behind resistor R400 in FIG. 4 and immediately below resistor R700 in FIG. 6.

The inductor coils L10, L20 and L30 as illustrated in the schematic circuit of FIG. 3 are associated with three of the transmission paths associated with three power blocks. For an eight-way combiner where N is equal to eight, there are five additional impedance matching circuits each essentially identical to circuits 50, 64 and 70 (see FIG. 3) and each includes an inductor coil. Consequently, for an eight-way combiner, the additional inductor coils will include inductor coils L40, L50, L60, L70 and L80. The combiner cabinet 100 illustrated in FIGS. 4, 5 and 6 represents an eight-way combiner and as discussed above includes eight reject loads. This combiner also includes eight impedance matching networks including inductors L10, L20, L30, L40, L50, L60, L70 and L80. These inductor coils are symmetrically arranged in the cabinet each having one end secured, as by soldering or the like, to a common point CP. This common point is illustrated in FIGS. 4 and 5 as being a rectangular plate of low impedance material and may be of dimension such as 15 inches by 15 inches and ⅛ inch thick. It is to be noted that the typical inductor coil such as coil L10 in this arrangement is approximately 15 inches in diameter and 16 inches long. These coils are arranged as shown in FIGS. 4 and 5 (it being understood that inductor coil L60 is directly behind inductor coil L20 in FIG. 4 and directly below inductor coil L50 in FIG. 5 and that inductor coil L80 is directly behind inductor coil L40 in FIG. 4 and directly below inductor coil L70 in FIG. 5).

With this configuration, the common point plate CP acts like a low impedance connection point and has very little inductance in order to avoid unequal coupling between the various coils. It is important to maintain these coils tied to a conductor which acts as much as possible like a conductive point in order to have the various coils act equally well. In the embodiment being illustrated, the conductive point CP takes the form of a plate. It is contemplated that it will provide adequate operation for frequencies up through 1.6 MHz which is within the AM broadcast band. If the operating frequency is increased such as to 3.6 MHz (the shortwave band), then it becomes more important to physically connect the inner ends of the inductor coils to a connection point as opposed to a plate. This is illustrated in FIGS. 7 and 8.

Figure 8:
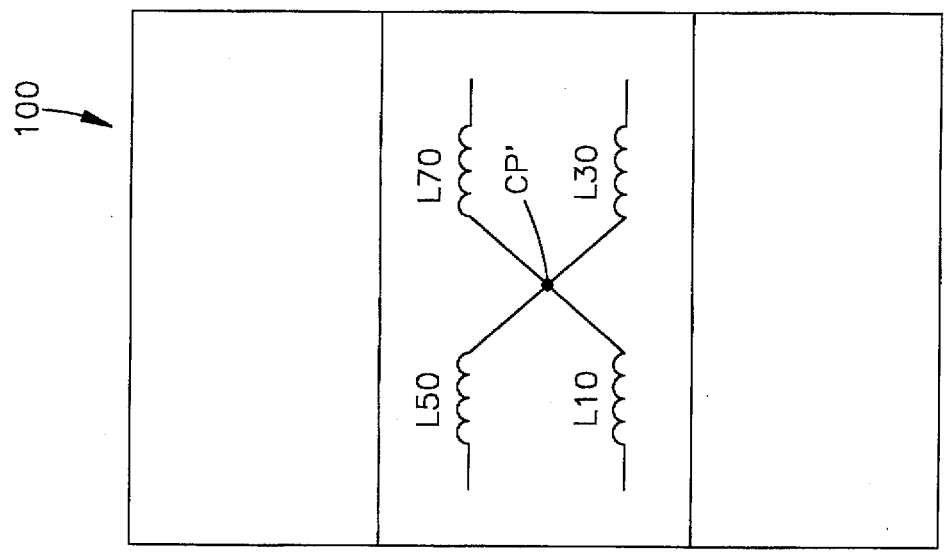
FIG. 8 is a view taken generally along line 8—8 in FIG. 7 looking in the direction of the arrows.
Figure 7:
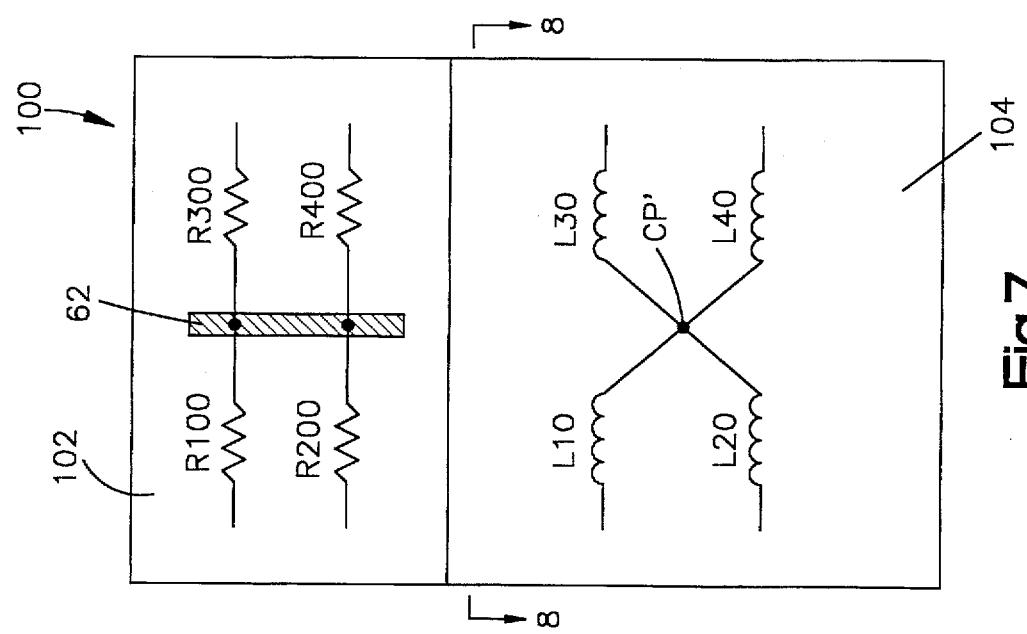
FIG. 7 is a view similar to that of FIG. 4 but showing an alternative embodiment wherein one end of each inductor coil is connected to a common junction point.

Reference is now made to FIGS. 7 and 8 in which the connection point CP' is a point connection and is connected to one end of all eight inductors L10, L20, L30, L40, L50, L60, L70 and L80, arranged in a manner as disclosed in FIGS. 7 and 8. Again, it is to be understood that inductor coil L60 is located immediately behind inductor coil L20 in FIG. 7 and immediately below inductor coil L50 in FIG. 8. Similarly, inductor coil L80 is located immediately behind inductor coil L40 in FIG. 7 and immediately below inductor coil L70 in FIG. 8.

Whereas the invention has been described in conjunction with preferred embodiments, it is to be appreciated that various modification will occur to those skilled in the art within the spirit and scope of the invention as defined by the appended claims.

Having described the invention, we claim the following:

1. An N-way power combiner for combining N RF signals wherein N is greater than 2 and comprising:

N input ports each for receiving an RF input signal;

a common output port;

N transmission paths respectively extending from said N input ports to said output port;

N reject loads respectively associated with said N paths, each said reject load having first and second ends with the second ends of said N reject loads being connected together in common;

N impedance networks respectively associated with said N paths;

each of said N impedance networks including an inductor coil;

a common connection means having opposing sides; and, said N inductor coils being symmetrically positioned relative to said common connection means with each coil thereof having one end electrically and mechanically secured to said common connection means.

2. An N-way power combiner as set forth in claim 1 wherein said N reject loads are positioned relative to a second connection means such that some of said reject loads are located on one side of said second connection means and the other of said reject loads are located on the other side of said second connection means.

3. An N-way power combiner as set forth in claim 2 wherein N is equal to at least three.

4. An N-way power combiner as set forth in claim 2 wherein N is equal to eight.

5. An N-way power combiner as set forth in claim 2 including N switching means each associated with one of said N paths and each switching means having a first position for connecting its associated input port and a said associated impedance network in a series circuit to said common output port and for also connecting said associated input port to the first end of said associated reject load.

6. An N-way power combiner as set forth in claim 5 wherein each said switching means has a second position for connecting said input port to a circuit ground and for connecting said associate impedance network with said circuit ground.

7. An N-way power combiner as set forth in claim 1 wherein said common connection means is a conductive plate.

8. An N-way power combiner as set forth in claim 1 wherein said common connection means is a conductive member.

* * * * *